(12) United States Patent
Makhota et al.

(10) Patent No.: US 9,312,399 B2
(45) Date of Patent: Apr. 12, 2016

(54) SYSTEMS AND METHODS FOR MAPPING THE CONNECTIVITY TOPOLOGY OF LOCAL MANAGEMENT UNITS IN PHOTOVOLTAIC ARRAYS

(75) Inventors: Maxym Makhota, Campbell, CA (US); Shmuel Arditi, Los Gatos, CA (US); Ron Hadar, Cupertino, CA (US)

(73) Assignee: TIGO ENERGY, INC., Los Gatos, CA (US)

( * ) Notice: Subject to any disclaimer, the term of this patent is extended or adjusted under 35 U.S.C. 154(b) by 1113 days.

(21) Appl. No.: 12/904,919

(22) Filed: Oct. 14, 2010

(65) Prior Publication Data
US 2011/0245989 A1 Oct. 6, 2011

Related U.S. Application Data

(60) Provisional application No. 61/341,686, filed on Apr. 2, 2010, provisional application No. 61/395,849, filed on May 17, 2010.

(51) Int. Cl.
*H01L 31/02* (2006.01)
*G06F 1/26* (2006.01)
*H01L 31/05* (2014.01)

(52) U.S. Cl.
CPC .......... *H01L 31/02021* (2013.01); *H01L 31/05* (2013.01); *Y02E 10/50* (2013.01)

(58) Field of Classification Search
CPC ................. H01L 31/02021; H01L 2023/4031; H01L 2023/405; H01L 23/4006; H01L 25/03; H01L 31/022425; H01L 31/042; H01L 31/05; Y02E 10/50; G05F 5/00; G05F 1/67; G01R 31/405; H02J 3/385; G06F 1/26
See application file for complete search history.

(56) References Cited

U.S. PATENT DOCUMENTS

| | | | |
|---|---|---|---|
| 5,235,266 A | 8/1993 | Schaffrin | |
| 5,268,832 A | 12/1993 | Kandatsu | |
| 5,566,022 A * | 10/1996 | Segev | 398/107 |
| 5,604,430 A | 2/1997 | Decker et al. | |
| 5,747,967 A | 5/1998 | Muljadi et al. | |

(Continued)

FOREIGN PATENT DOCUMENTS

| | | |
|---|---|---|
| AU | 2005262278 | 7/2005 |
| DE | 4232356 | 3/1994 |

(Continued)

OTHER PUBLICATIONS

Alonso, R. et al., "A New Distributed Converter Interface for PV Panels," 20th European Photovoltaic Solar Energy Conference, Barcelona, Spain, pp. 2288-2291, Jun. 6-10, 2005.

(Continued)

*Primary Examiner* — Kenneth M Lo
*Assistant Examiner* — Sunray R Chang
(74) *Attorney, Agent, or Firm* — Greenberg Traurig LLP

(57) ABSTRACT

Provided are a system and method for determining a connectivity topology of local management units (LMUs) in a solar photovoltaic power generation (SPVPG) system. Each of the LMUs is connected within the SPVPG between a solar panel and a set of power lines of the SPVPG. The set of power lines connects the LMUs to form a network. The connectivity topology of LMUs in the network is determined using, for example, indirect indications of connections of an LMU and the SPVPG and indications of the physical location of the LMU with respect to other elements of the SPVPG.

19 Claims, 8 Drawing Sheets

(56) References Cited

U.S. PATENT DOCUMENTS

| | | | |
|---|---|---|---|
| 5,923,158 | A | 7/1999 | Kurokami et al. |
| 6,275,016 | B1 | 8/2001 | Ivanov |
| 6,448,489 | B2 | 9/2002 | Kimura et al. |
| 6,650,031 | B1 | 11/2003 | Goldack |
| 6,844,739 | B2 | 1/2005 | Kasai et al. |
| 6,894,911 | B2 | 5/2005 | Telefus et al. |
| 6,984,970 | B2 | 1/2006 | Capel |
| 7,061,214 | B2 | 6/2006 | Mayega |
| 7,248,946 | B2 | 7/2007 | Bashaw et al. |
| 7,256,566 | B2 | 8/2007 | Bhavaraju et al. |
| 7,276,886 | B2 | 10/2007 | Kinder |
| 7,518,346 | B2 | 4/2009 | Prexl |
| 7,595,616 | B2 | 9/2009 | Prexl |
| 7,605,498 | B2 | 10/2009 | Ledenev et al. |
| 7,719,140 | B2 | 5/2010 | Ledenev et al. |
| 8,138,631 | B2 | 3/2012 | Allen et al. |
| 8,384,243 | B2 | 2/2013 | Adest et al. |
| 8,509,032 | B2 * | 8/2013 | Rakib ............ 367/140 |
| 8,922,061 | B2 | 12/2014 | Arditi |
| 2005/0057214 | A1 | 3/2005 | Matan |
| 2005/0057215 | A1 | 3/2005 | Matan |
| 2005/0105224 | A1 * | 5/2005 | Nishi ............... 361/18 |
| 2005/0162018 | A1 * | 7/2005 | Realmuto et al. ......... 307/44 |
| 2006/0001406 | A1 | 1/2006 | Matan |
| 2006/0162772 | A1 * | 7/2006 | Presher et al. ............ 136/290 |
| 2006/0174939 | A1 * | 8/2006 | Matan ............ 136/293 |
| 2006/0185727 | A1 | 8/2006 | Matan |
| 2006/0225781 | A1 * | 10/2006 | Locher ............ 136/245 |
| 2007/0027644 | A1 | 2/2007 | Bettenwort et al. |
| 2007/0107767 | A1 * | 5/2007 | Hayden et al. ............ 136/244 |
| 2007/0176767 | A1 * | 8/2007 | Baumgaertner et al. ...... 340/538 |
| 2007/0235071 | A1 | 10/2007 | Work et al. |
| 2007/0273351 | A1 | 11/2007 | Matan |
| 2008/0121272 | A1 | 5/2008 | Besser et al. |
| 2008/0122449 | A1 | 5/2008 | Besser et al. |
| 2008/0122518 | A1 | 5/2008 | Besser et al. |
| 2008/0179949 | A1 | 7/2008 | Besser et al. |
| 2008/0191560 | A1 | 8/2008 | Besser et al. |
| 2008/0191675 | A1 | 8/2008 | Besser et al. |
| 2008/0207357 | A1 * | 8/2008 | Savarese et al. ............ 473/407 |
| 2008/0236648 | A1 | 10/2008 | Klein et al. |
| 2008/0238195 | A1 | 10/2008 | Shaver et al. |
| 2008/0303503 | A1 | 12/2008 | Wolfs |
| 2009/0206666 | A1 | 8/2009 | Sella et al. |
| 2010/0026097 | A1 * | 2/2010 | Avrutsky et al. ............ 307/43 |
| 2010/0043868 | A1 | 2/2010 | Sun et al. |
| 2010/0133911 | A1 | 6/2010 | Williams et al. |
| 2011/0132424 | A1 * | 6/2011 | Rakib ............ 136/244 |
| 2011/0227411 | A1 | 9/2011 | Arditi |
| 2012/0042588 | A1 | 2/2012 | Erickson, Jr. |

FOREIGN PATENT DOCUMENTS

| | | |
|---|---|---|
| DE | 19961705 | 7/2001 |
| EP | 1388774 | 2/2004 |
| ES | 2249147 | 3/2006 |
| JP | 2001060120 | 3/2001 |
| JP | 2001075662 | 3/2001 |
| JP | 2005251039 | 9/2005 |
| WO | 03012569 | 2/2003 |

OTHER PUBLICATIONS

Alonso, R. et al., "Experimental Results of Intelligent PV Module for Grid-Connected PV Systems," 21st European Photovoltaic Solar Energy Conference, Dresden, Germany, pp. 2297-2300, Sep. 4-8, 2006.

Basso, Tim, "IEEE Standard for Interrconnecting Distributed Resources With the Electric Power System," IEEE PES Meeting, Jun. 9, 2004.

Boostbuck.com, "The Four Boostbuck Topologies," located at http://www.boostbuck.com/TheFourTopologies.html, 2003.

Enslin, Johan H.R., et al., "Integrated Photovoltaic Maximum Power Point Tracking Converter," IEEE Transactions on Industrial Electronices, vol. 44, No. 6, pp. 769-773, Dec. 1997.

Gautam, Nalin K. et al., "An Efficient Algorithm to Simulate the Electrical Performance of Solar Photovoltaic Arrays," Energy, vol. 27, No. 4, pp. 347-361, 2002.

Linares, Leonor et al., "Improved Energy Capture in Series String Photovoltaics via Smart Distributed Power Electronics," 24th Annual IEEE Applied Power Electronics Conference and Exposition, pp. 904-910, Feb. 15, 2009.

Nordmann, T. et al., "Performance of PV Systems Under Real Conditions," European Workshop on Life Cycle Analysis and Recycling of Solar Modules, The "Waste" Challenge, Brussels, Belgium, Mar. 18-19, 2004.

Palma, L. et al., "A Modular Fuel Cell, Modular DC-DC Converter Concept for High Performance and Enhanced Reliability," 38th IEEE Power Electronics Specialists Conference (PESC'07), pp. 2633-2638, Jun. 17, 2007.

Quaschning, V. et al., "Cost Effectiveness of Shadow Tolerant Photovoltaic Systems," Eurosun 96, pp. 819-824, Sep. 16, 1996.

Roman, Eduardo, et al., "Intelligent PV Module for Grid-Connectred PV Systems," IEEE Transactions on Industrial Electronics, vol. 53, No. 4, pp. 1066-1073, Aug. 2006.

Uriarte, S. et al., "Energy Integrated Management System for PV Applications," 20th European Photovoltaic Solar Energy Conference, Jun. 6, 2005.

Walker, G. R. et al., "Cascaded DC-DC Converter Connection of Photovoltaic Modules," 33rd IEEE Power Electronics Specialists Conference (PESC'02), vol. 1, pp. 24-29, 2002.

Walker, Geoffrey R. et al., "Cascaded DC-DC Converter Connection of Photovoltaic Modules," IEEE Transactions on Power Electronics, vol. 19, No. 4, pp. 1130-1139, Jul. 2004.

International Patent Application No. PCT/US2011/029392, International Search Report and Written Opinion, Oct. 24, 2011.

* cited by examiner

SYSTEMS AND METHODS FOR MAPPING THE CONNECTIVITY TOPOLOGY OF LOCAL MANAGEMENT UNITS IN PHOTOVOLTAIC ARRAYS

CROSS-REFERENCE TO RELATED APPLICATIONS

The present application claims the benefit of Provisional U.S. Application Ser. No. 61/341,686, filed Apr. 2, 2010 and entitled "System and Method for Mapping the Connectivity Topology of Local Management Units in Large Photovoltaic Arrays," and Provisional U.S. Application Ser. No. 61/395,849 filed May 17, 2010 and also entitled "System and Method for Mapping the Connectivity Topology of Local Management Units in Large Photovoltaic Arrays," the disclosures of which are incorporated herein by reference.

FIELD OF THE TECHNOLOGY

At least some embodiments of this disclosure relate to photovoltaic systems in general.

BACKGROUND

A solar photovoltaic power generation ("SPVPG") system may use a plurality of solar panels connected together to increase power output of the system. The solar panels may be connected in parallel, in series, or in combination thereof, such as parallel strings of serial connected solar panels. The way the solar panels are connected represents the connectivity topology of the solar panels. The connectivity topology may have impact on the efficiency and the performance of the SPVPG system. For example, if one or more solar panels are misconnected to form an incorrect topology, the SPVPG system may have a degraded performance.

SUMMARY OF THE DESCRIPTION

Systems and methods to enhance the performance of a photovoltaic system in accordance with the present disclosure are described herein. Some embodiments are summarized in this section.

In one aspect, the disclosure describes a solar photovoltaic power generation system, including a set of power lines, a plurality of photovoltaic panels, and a plurality of local management units, each of the plurality of local management units coupled between the set of power lines and a corresponding photovoltaic panel of the plurality of photovoltaic panels. The system further includes a master management unit having a communications device adapted to transmit instructions to the plurality of local management units to stop the local management units outputting to the set of power lines one at a time and to receive power production information from the local management units outputting power to the set of power lines of the solar photovoltaic power generation system. The master management unit further includes a processor adapted to determine a connectivity topology of the plurality of local management units on the set of power lines based at least in part on the power production information.

In another aspect, the disclosure describes a solar photovoltaic power generation system, including a set of power lines, a plurality of photovoltaic panels, and a plurality of local management units, each of the plurality of local management units coupled between the set of power lines and a corresponding photovoltaic panel of the plurality of photovoltaic panels. The system further includes a transmitter adapted to transmit a signal to the local management units and a receiver adapted to receive at least one response to the signal. The system further includes a master management unit including a communications device adapted to communicate information with the local management units connected to the set of power lines of the solar photovoltaic power generation system. The master management unit further includes a processor adapted to determine a connectivity topology of the plurality of local management units on the set of power lines based at least in part on the at least one response.

In another aspect, the disclosure describes a method including receiving identification information of a plurality of local management units in a solar photovoltaic power generation system having a plurality of photovoltaic panels, each of the plurality of local management units coupled between a corresponding one of the plurality of photovoltaic panels and a set of power lines of the solar photovoltaic power generation system. The method further includes transmitting a command addressed to a first local management unit of the plurality of local management units based on the identification information, the command to instruct the first local management unit to change power output from a first photovoltaic panel of the plurality of photovoltaic panels, the first photovoltaic panel controlled by the first local management unit. The method further includes after transmitting the command to the first local management unit, receiving first power production information from at least one of the plurality of local management units other than the first local management unit, and determining a connectivity topology of the first local management unit within the solar photovoltaic power generation system based on the first power production information.

Other embodiments and features of the present disclosure will be apparent from the accompanying drawings and from the detailed description which follows.

BRIEF DESCRIPTION OF THE DRAWINGS

The embodiments are illustrated by way of example and not limitation in the figures of the accompanying drawings in which like references indicate similar elements.

DETAILED DESCRIPTION

The following description and drawings are illustrative and are not to be construed as limiting. Numerous specific details are described to provide a thorough understanding. However, in certain instances, well known or conventional details are not described in order to avoid obscuring the description. References to one or an embodiment in the present disclosure are not necessarily references to the same embodiment; and, such references mean at least one.

In one embodiment, each solar panel (or photovoltaic panel) is connected to other panels via a local management unit. Each local management unit manages one solar panel and thus represents the solar panel. The connectivity topology of the local management units thus represents the connectivity topology of the solar panels in the system.

In one embodiment, the local management units are used in the automated detection of the connectivity topology of the local management units and thus the connectivity topology of the solar panels. Thus, for example, if errors were made in the installation, the automated detection of the connectivity topology can be used to detect the errors. Further, the connectivity topology of the local management units provides information about the strings on which the local management units are located and/or the sequences in which the local management units are connected, both electrically and physically. Such information can be used in various applications.

One embodiment provides a system and method for determining a connectivity topology of one or more local management units (LMU) in a solar photovoltaic power generation (SPVPG) system using, for example, indirect indications of connections of an LMU and the SPVPG and indications of the physical location of the LMU with respect to other elements of the SPVPG.

As used herein, the term "connectivity topology" refers to information about how components are connected within an SPVPG system, without specific regard to a particular level of detail of the mapping. For example, a connectivity topology may be created with a first level of detail and then revised to a second level of detail. Furthermore, a connectivity topology may be created with a level of detail at a particular level that is less than a complete description of all connections (and/or their order) within an SPVPG system.

In an SPVPG system, LMUs may be connected in configurations, such as, for example, serial, parallel and a combination thereof, as described in U.S. patent application Ser. No. 12/691,692. As another example, the SPVPG system may control LMUs within the SPVPG as described in U.S. patent application Ser. No. 12/840,228. The contents of the above-discussed patent applications and publications are incorporated herein by reference.

Figure 1:
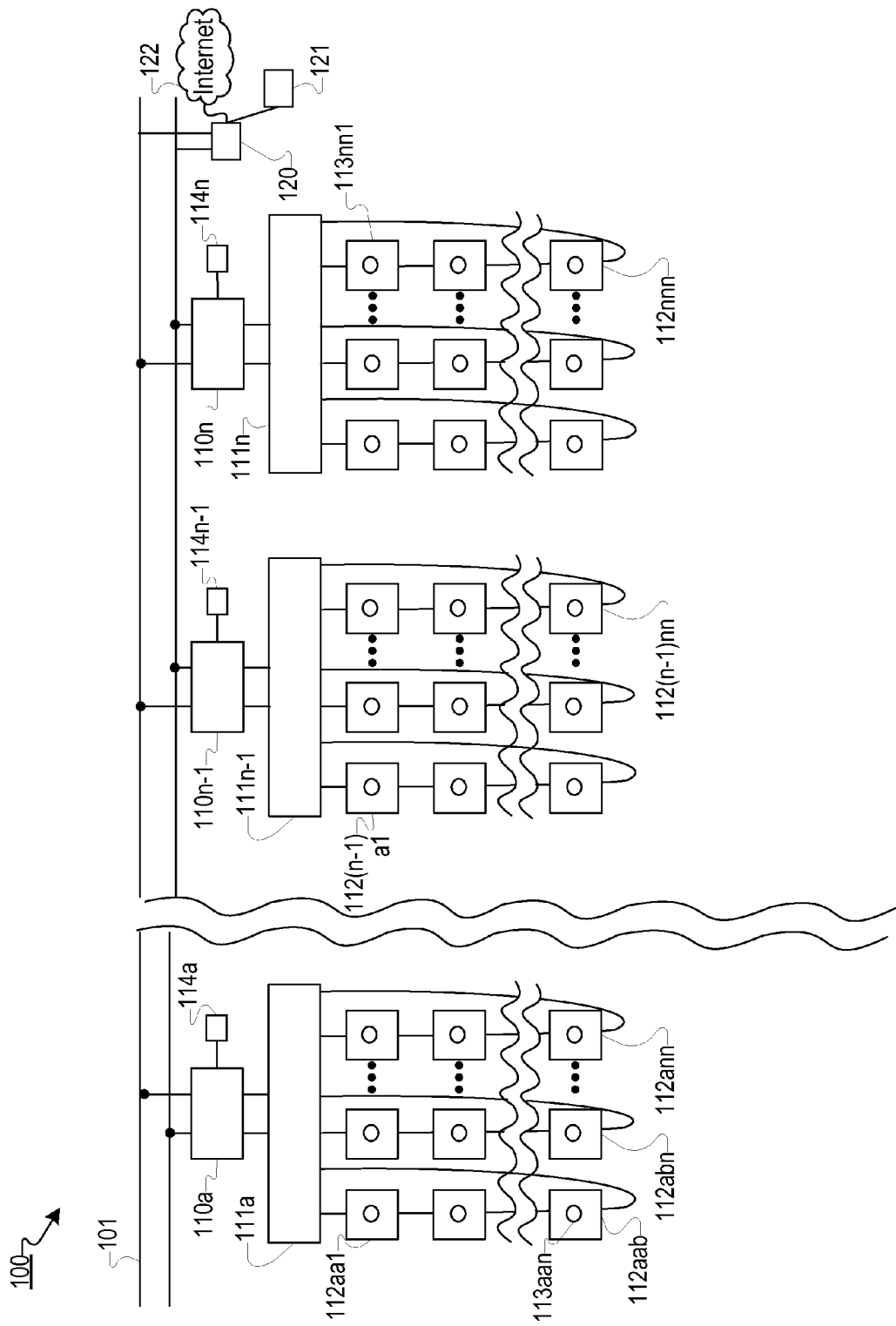
FIG. 1 shows an exemplary solar photovoltaic power generation (SPVPG) system with a number of inverters, according to an embodiment of the present disclosure.

FIG. 1 shows an exemplary SPVPG system with a number of inverters, according to an embodiment of the present disclosure. The SPVPG system 100 includes a connection to an alternating current (AC) grid 101 and multiple inverters 110a-n adapted to invert direct current (DC) from combiner boxes 111a-111n into AC for delivery to the AC grid. Each of the inverters 110a-n may have its own communication interface 114a-n adapted for communicating information relating to the operations of the inverter to, for example, the master management unit (MMU) 120, other portions of the SPVPG system and/or the Internet 122. The SPVPG system generates power via solar (e.g., photovoltaic or PV) panels 112aa1-112nnn. Optionally each panel may include an LMU 113aa1-113nnn. The SPVPG system may include an MMU 120, which may contain an MMU software instance 121, either or both of which may also be coupled or connected to the Internet 122. In this description, the Internet 122 is used as an exemplary communications network and another network may also be used alone or in combination such as, for example, a wired network, power-line network, radio network, wireless network, 802.11 network, infrared network, ultrasound network, etc.

While communication interfaces 114a-n are shown for each inverter, it should be understood that other configurations are possible, including using multiple connections and communications protocols to allow the components of the SPVPG system 100 to communicate with one another. Exemplary communications between components of the SPVPG system 100 include transmitting and receiving operational data, as well as transmitting, receiving, and confirming instructions and/or commands. As described further herein, exemplary communications may be used to determine or ascertain the topology or configurations of components of the SPVPG system 100. Any suitable network technology or combination of network technologies may be used including, but not limited to, wired, over power lines, wireless radio, radio, wireless, 802.11, infrared, ultrasound, etc., including the multiple variations of protocols of each technology.

In one embodiment, the MMU 120 is in communication with the SPVPG system 100 and receives data from components of the SPVPG system, whether in response to a specific request or as part of a polling/reporting protocol. In one embodiment, more than one MMU 120 may be present (e.g., in very large systems), and each of the MMUs 120 may be networked directly to one another, or via the Internet 122 or other network connections, if present, or both. The MMU 120 may issue instructions or commands to control each of the LMUs 113aaa-113nnn through the communications channels with the SPVPG system components.

LMUs 113 may connect the PV panels 112 in an SPVPG system 100 in many different ways. In one embodiment, particularly in system configurations utilizing serial connections, each panel 112 has an LMU 113 which connects the corresponding panel 112 to a series power bus (e.g., a string of LMUs). The LMU 113 may be used to monitor and control the power output from the corresponding panel 112. For example, the LMU 113 may contain circuitry to measure various operating parameters (such as power output, temperature, voltage, current) of the respective solar panel unit(s) and may connect, disconnect and/or pulse-width modulate the power from the corresponding panel 112. In one embodiment, an LMU 113 may contain a communicator or communications device to transmit the operating parameters and to receive instructions, for example, from an MMU 120 or other controller. In another embodiment, described further herein, an LMU may contain a communicator or communications device that may be used, at least in part, to provide an indication of the location of the LMU relative to other parts of the SPVPG system 100. In one embodiment, particularly in system configurations utilizing parallel connections, an LMU 113 may contain a DC to DC step-up converting device for connecting the solar panel unit(s) monitored and controlled by the LMU to a parallel bus. In one embodiment, the LMU 113 may contain a maximum power point tracking (MPPT) device and/or may perform maximum power point (MPP) tracking functions. In another embodiment, the LMU 113 may communicate with another controller, such as the MMU 120, to allow the other controller to monitor and instruct the LMU to adjust the operation point of the corresponding PV panel 112 (e.g., to track the MPP). For example, the LMU 113 may communicate operational parameters to an MMU 120 that may select or compute an operation point for the LMU 113 and/or perform the MPP tracking functions (e.g., via instructing the LMU to adjust how the solar panel unit(s) are operated to track the MPP of the solar panel unit(s)). Various configurations and functions of the LMUs are described in U.S. patent application Ser. Nos. 12/392,042, 12/612,641, 12/411,317 (now issued as U.S. Pat. No. 7,602,080), and Ser. No. 12/840,228, the disclosures of which are incorporated herein by reference.

An SPVPG system 100 may be arranged differently in many possible embodiments of varied complexity and size. FIG. 1 indicates this exemplary range of possible complexities and sizes of the SPVPG system 100 via vertical interruption lines, horizontal interruption lines and through ellipsis. The exemplary SPVPG system 100 is arranged using strings of panels 112. An exemplary string of panels is the string on the left of FIG. 1, namely panels 112aa1-112aab.

In one embodiment, a string local management unit (SLMU) is used to control the output of an individual string, and some SPVPG systems may include an SLMU for each string. In one embodiment, the SLMU(s) may be contained within the combiner box 111. In one embodiment, the SLMU may be contained separately from the combiner box 111. In one embodiment, the SLMU includes a DC to DC converting device to convert the DC voltage of a string to a parallel bus DC voltage before it is combined by the combiner box 111. The DC to DC conversion may be performed by the DC to DC converting device contained in an SLMU based on communication with the MMU 120. Alternatively, the SLMU may include a stand-alone DC to DC converting device. Configurations of SLMUs, combiner boxes, panels and strings of panels are described in U.S. patent application Ser. Nos. 12/691,692, 12/628,977, and 12/612,641, the disclosures of which are incorporated herein by reference.

After conversion of the DC voltage of each string to a DC voltage compatible with the parallel bus, there may be several strings of panels 112 connected to a combiner box 111 that may connect each string in parallel to a single DC bus that is connected to an inverter 110. In some embodiments, SLMUs are not used. The inverter 110 connects to the DC bus from the combiner box 111 and to the AC grid 101, inverting the power received from the DC bus into alternating current for placement onto the AC grid.

The operations of MPP tracking may be performed by several types of components in an SPVPG system, and these components may be broadly referred to as MPPT devices to describe their function of performing MPP tracking, regardless of any other functions the components may perform in the SPVPG system. In some instances, an MPPT device may be simply referred to as an inverter due to the presence of MPPT devices and/or functionality present in inverters. However, this description should not limit the understanding from this disclosure that inverters are one of several types of components that may include MPPT devices and/or functionality. For example, LMU devices may contain MPPT devices and/ or functionality.

Different variations of elements of the SPVPG systems and components in some embodiments are discussed in other applications, including, for example, U.S. Provisional Application Ser. No. 61/335,566, and U.S. patent application Ser. No. 12/411,317 (now issued as U.S. Pat. No. 7,602,080), Ser. Nos. 12/612,641 and 12/628,977, the disclosures of which are incorporated herein by reference. For example, in one embodiment, each photovoltaic panel 112aa1-112nnn may have its own LMU 113. In another embodiment, each string of panels (e.g., 112aa1-112aab) may have a single LMU associated with the string, namely a string local management unit (SLMU), at its end controlling the string of panels. In another embodiment, an LMU may be configured to control the operation of a different grouping of multiple panels 112. In addition, any SPVPG system 100 may include different and varied distributions of LMUs 113 throughout the system. In one embodiment, each of the strings connected to the combiner box (e.g., 111a) has only one panel. In one embodiment, each of the strings connected to the combiner box (e.g., 111a) has a plurality of panels connected in series. In one embodiment, a single string of panels (e.g., 112aa1-n) is connected directly to the inverter 110a without the combiner box (e.g., 111a) (and the other strings).

Figure 2A:
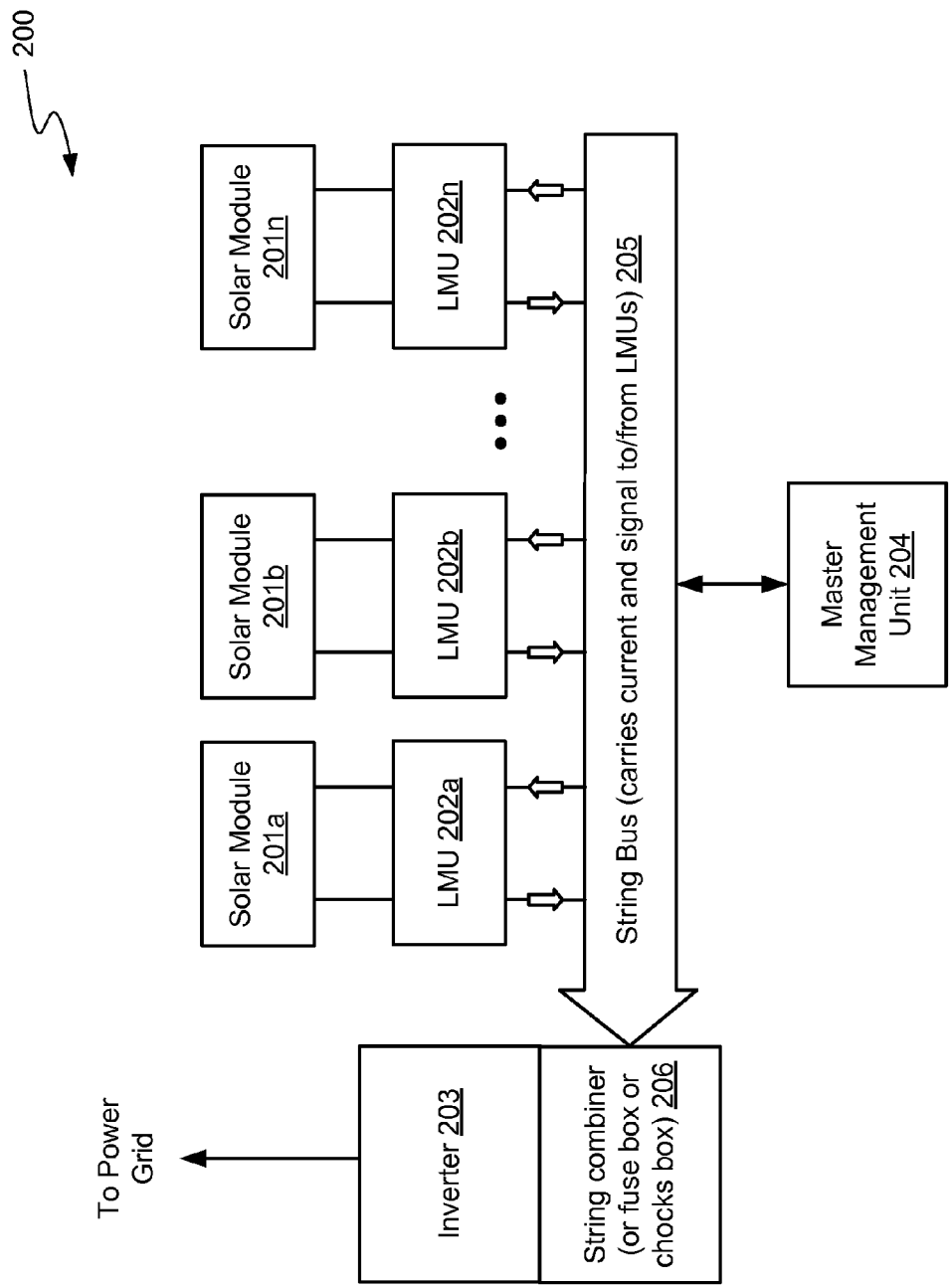
FIG. 2A shows an exemplary portion of an SPVPG system with an exemplary embodiment of a configuration of local management units (LMUs) and connections between the LMUs and other portions of the SPVPG.

FIG. 2A shows an exemplary portion of an SPVPG system 200 with an exemplary embodiment of a configuration of LMUs and connections between the LMUs and other portions of the SPVPG. As described further herein, systems and processes may be unaware of a particular configuration or connectivity topology of portions of an SPVPG system. For example, the LMUs of the portion of the SPVPG may be connected to a string in an unknown order or configuration (e.g., serial, parallel, a combination thereof) and/or may be connected to different strings and/or different parts of the system. In FIG. 2A, the SPVPG system 200 is built from a few components, including photovoltaic modules (201a, 201b, . . . , 201n), LMUs (202a, 202b, . . . , 202n), an inverter (203), and an MMU (204).

In one embodiment, the master management unit (204) is part of the inverter (203), the combiner box (206), an LMU, or a stand-alone unit. The solar modules (201a, 201b, . . . , 201n) are connected in parallel to the LMUs (202a, 202b, . . . , 202n) respectively, which are connected in series to form a string bus (205), which eventually is connected to the inverter (203) and the management unit (204). The solar module (201a), for example, is connected to the LMU (202a) by the terminals of the LMU (382, 384, 386 in FIG. 3). As shown in FIG. 2A, in one embodiment, the terminal that connects to the panel voltage and the string voltage is connected to the depicted left connection between the solar module (201a) and the LMU (202a) and connected to the depicted left connection between the LMU (202a) and the string bus (205). The terminal that is connected to the panel voltage is connected to the depicted right connection between the between the solar module (201a) and the LMU (202a). The terminal that is connected to the string voltage is connected to the depicted right connection between the LMU (202a) and the string bus (205).

In FIG. 2A, the string bus (205) can be connected to the inverter (203) directly or as part of a mesh network or combiner boxes or fuse boxes (not shown). An isolated LMU can be used as a combiner box (206) to adjust all voltages before connecting to the inverter (203); or, a single or multi-string inverter can be used. To limit the changes in the voltage of the string bus (205), the master management unit (204) can assign a different phase for each of the LMUs (202a, 202b, . . . , 202n). In one embodiment, at any given time, a maximum of a predetermined number of solar modules (e.g., one single solar module) are disconnected from the string bus (205).

In one embodiment, beyond the module connection, the LMUs can have signal inputs, including but not limited to duty cycle, phase and synchronization pulse (e.g., to keep the LMUs synchronized). In one embodiment, the phase and the synchronization pulse are used to further improve performance, but the LMUs can work without them.

In one embodiment, the LMU (202) can provide output signals. For example, the LMU (202) can measure current and voltage at the module side and optionally measure current and voltage in the string side. The LMU (202) can provide other suitable signals, including but not limited to measurements of light, temperature (both ambient and module), etc.

In one embodiment, the output signals from the LMU (202) are transmitted over the power line (e.g., via power line communication (PLC)), or transmitted wirelessly.

In one embodiment, the MMU (204) receives sensor inputs from light sensor(s), temperature sensor(s), one or more each for ambient, solar module or both, to control the SPVGP system (200). In one embodiment, the signals can also include synchronization signals. For example, an LMU can send synchronization signals periodically to set the timing values, etc.

Using the described methods, the LMU can be a very non-expensive and reliable device that can easily increase the throughput of a photovoltaic solar system by a few (e.g., signal or low double digits) percentage points. These varied controls also allow installers using this kind of system to control the VOC (open circuit voltage) by, for example, shutting off some or all modules. For example, by using the LMUs of the system, a few modules can be disconnected from a string if a string is getting to the regulatory voltage limit, and thus more modules can be installed in a string.

In some embodiments, LMUs can also be used within the solar panel to control the connection of solar cells attached to strings of cells within the solar panel.

Figure 2B:
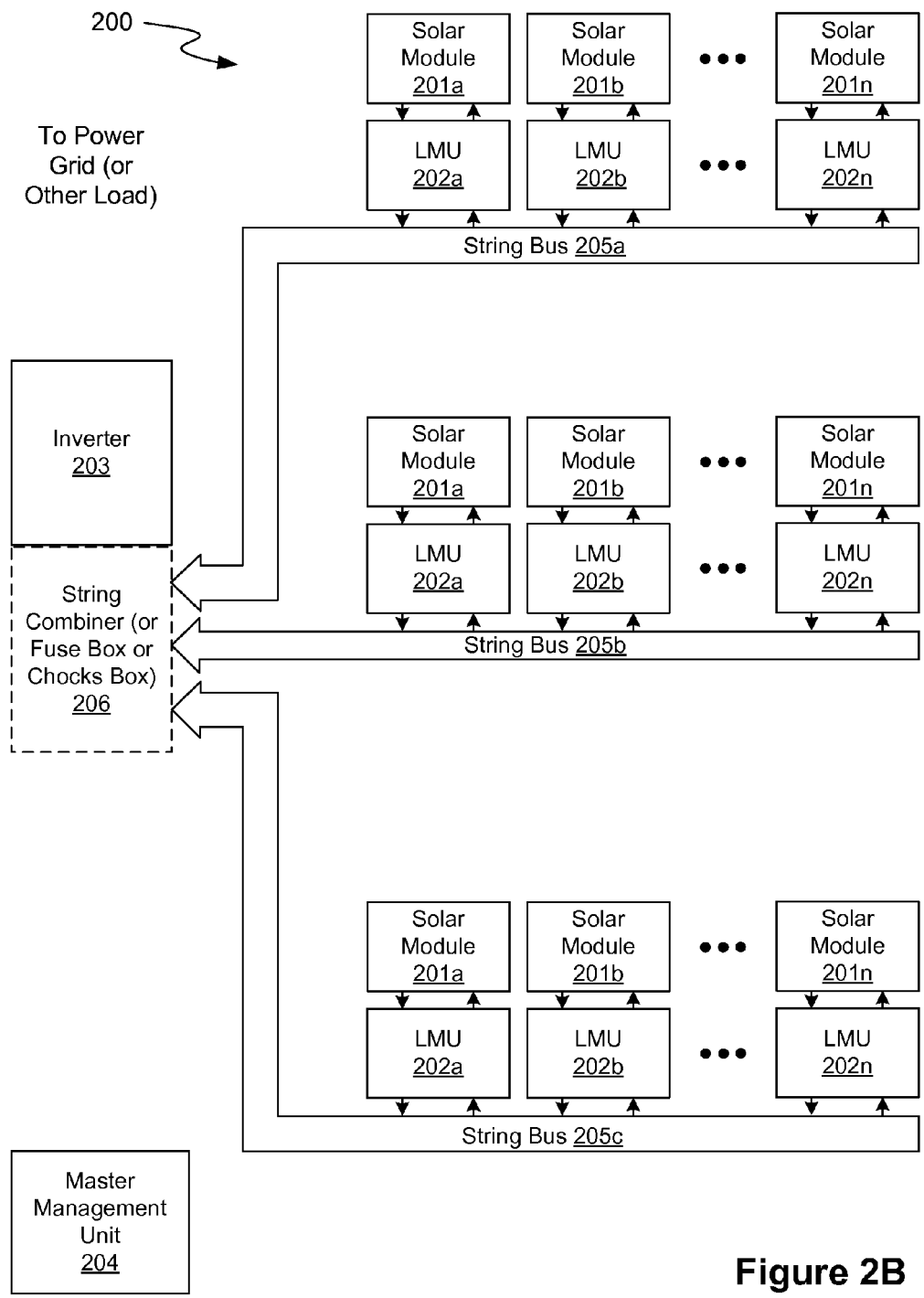
FIG. 2B illustrates an embodiment of a solar array along with an inverter and a string combiner.

FIG. 2B illustrates an embodiment of a solar array along with an inverter and a string combiner. In the illustrated embodiment, the solar array (200) includes three string buses (205a, 205b, 205c), although one or more string buses (205a, 205b, 205c) can also be used. The string buses enable a series connection of solar modules (201a, 201b, . . . , 201n). Coupled between each solar module (201a, 201b, . . . 201n) and its corresponding string bus (205a, 205b, 205c), is an LMU (202a, 202b, . . . , 202n). The LMUs (202a, 202b, . . . , 202n) are controlled by a controller (204). The controller (204) can communicate wirelessly with the LMUs (202a, 202b, . . . , 202n) or via wireless repeaters. In an embodiment (not illustrated), wired connections between the controller (204) and the LMUs (202a, 202b, . . . , 202n) can be implemented. String bus (205a, 205b, 205c) outputs are connected at an inverter (203) or in an optional string combiner (206). The controller (204) can be configured to balance current outputs from the solar modules on a string bus (205a, 205b, 205c). This can be done for each string bus (205a, 205b, 205c). Once the current outputs from solar modules (201a, 201b, . . . , 201n) on a string bus (205a, 205b, 205c) are balanced (weak solar module currents are raised to the level of strong solar module currents within a string), the controller (204) can balance the current outputs from the string buses (205a, 205b, 205c) (strong string bus voltages are lowered to the level of weak string bus voltages, which in turn raise strong string bus currents and hence the solar array current). This process can be repeated, or an inverter (203) can then attempt to determine the MPPT for the solar array (200).

A "solar array" typically comprises two or more solar modules series-connected via a string bus where the output voltage is a sum of the voltages of the series-connected solar modules. In larger solar arrays, string buses can be connected in parallel such that their currents add. A combiner and inverter are not part of the solar array.

Balancing current outputs of solar modules (201a, 201b, . . . , 201n) on a string bus (205a, 205b, 205c) will now be discussed in more depth. The controller (204) can be configured to balance the currents produced by the solar modules (201a, 201b, . . . , 201n) on a given string bus (205a, 205b, 205c), and perform this balancing for each string bus (205a, 205b, 205c). As a result, the currents from the solar modules (201a, 201b, . . . , 201n) on a string bus (205a, 205b, 205c) can be balanced.

In order to balance solar modules (201a, 201b, . . . , 201n) on a string bus (205a, 205b, 205c), it can be useful to identify strong solar modules (201a, 201b, . . . , 201n) and weak solar modules (201a, 201b, . . . , 201n). This is done by varying the current on a string bus (205a, 205b, 205c), monitoring the resulting change in voltage in each solar module (201a, 201b, . . . , 201n), and comparing the changes in voltage on each solar module (201a, 201b, . . . , 201n) to identify strong solar modules (201a, 201b, . . . , 201n) and weak solar modules (201a, 201b, . . . , 201n).

Varying the current on the string bus (205a, 205b, 205c) can involve the inverter (203) pulling a different current from the string bus (205a, 205b, 205c). It can involve varying an impedance seen by the string bus (205a, 205b, 205c). For instance, the inverter (203) can vary the impedance that the string bus (205a, 205b, 205c) sees, and in doing so will vary the current and voltage produced by the solar modules (201a, 201b, . . . , 201n) on the string bus (205a, 205b, 205c). In other words, pulling a different current or changing the impedance changes the location on the I-V curve at which each solar module (201a, 201b, . . . , 201n) operates. Since current for devices connected in series is the same, a change in current on the string bus (205a, 205b, 205c) causes the same change in current for each solar module (201a, 201b, . . . , 201n) on the string bus (205a, 205b, 205c). However, the changes in voltage may not be the same, since the solar modules (201a, 201b, . . . , 201n) can operate at different operating points on the I-V curve.

Figure 3:
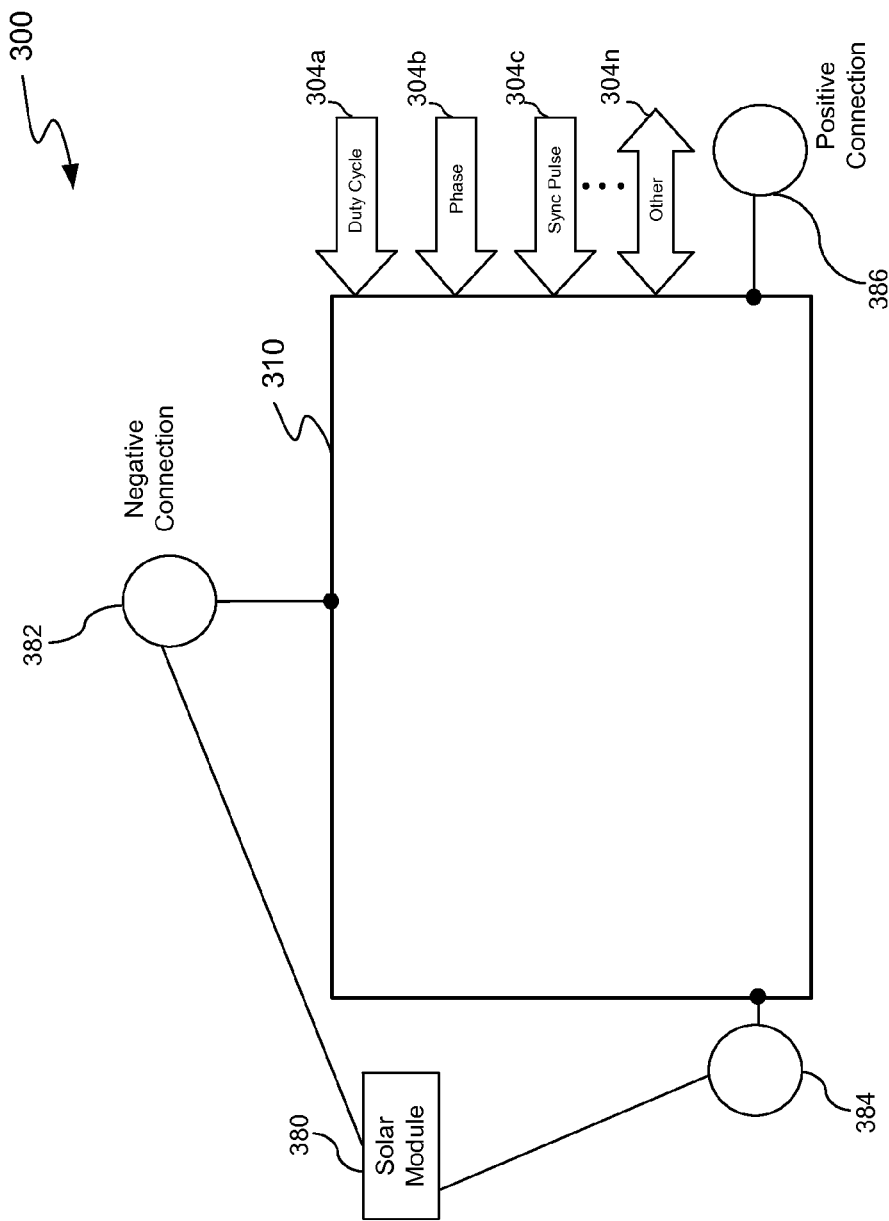
FIG. 3 shows exemplary connection of an LMU to a solar module in an SPVPG system.

FIG. 3 shows exemplary connection 300 of an LMU 310 to a solar module 380 in an SPVPG system. An LMU 310 may be configured to control the manner in which the solar module 380 connects to the rest of the system. As described and referenced further herein, the LMU 310 may control the current and/or voltage of the solar module 380 as it connects to other portions of the system. The negative connection terminal 382 and positive connection terminal 386 are shown representing connections to a string bus or other power line of the SPVPG system. In the embodiment shown, the LMU 310 controls the connection between the solar module 380 and one of the terminals of the solar module through connecting to the solar module and providing a circuit through which the current from the solar module may flow to the positive connection terminal 386. The LMU 310 may also connect to the negative terminal 382, for example, to monitor the state of the power line bus (e.g., string bus).

The polarity of the connections of the negative connection terminal 382 and positive connection terminal 386 to the power line may be reversed with respect to the solar module 380. For example, in one embodiment, the negative connection terminal 382 and the positive connection terminal 386 have reversed polarities, and in particular, the negative connection from the solar module connects through the LMU 310 (i.e., the negative connection of the solar module connects to intermediate connection 384) and the positive connection from the solar module connects directly to the power line.

The exemplary connections shown with the LMU 310 include a control interface including signals 304a-304n. In one embodiment, the control interface includes duty cycle control signal 304a, phase signal 304b, synchronization pulse 304c and other signals 304n, as described further herein. For example, the LMU 310 may connect to an MMU through this interface for receiving control instructions, reporting status information (e.g., power production status of solar module 380).

As further described and referenced herein, the LMU 310 may control the power production of the solar module 380 and the interaction with the power line (e.g., string bus) through the positive connection terminal 386 and the negative connection terminal 382. For example, the LMU 310 may adjust the voltage and/or current produced by the solar module 380. As another example, the LMU 310 may stop power production by the solar module 380. As used herein, the term power production by a solar module refers to providing power to or receiving power from the power lines (e.g., string bus) of the SPVPG system. In one embodiment, the LMU 310 may stop power production from the solar module 380 by stopping the flow of current (e.g., creating an open circuit) between intermediate terminal 384 and positive terminal 386, thereby effectively disconnecting one side of the solar module from the power lines. In another embodiment, the LMU 310 is instructed to stop power production from the solar module 380 by allowing current to flow on the power lines without any addition of power from the solar module 380. For example, the LMU 310, when connected in a series connection with the power line, may create a short circuit between negative connection terminal 382 and positive connection terminal 386, thereby passing the current between the two terminals with no addition of power from the solar module 380. In another embodiment, the LMU 310 is instructed to create an open circuit between all three terminals 382, 384, and 386, thereby interrupting the power production of an entire series-connected bus.

In another embodiment, the LMU 310 may modulate the power production of the solar module 380 somewhere between the maximum power output of the solar module 380 and a zero power output state, as described and referenced further herein. For example, the LMU 310 may create an open circuit between the negative connection terminal 382 and both the intermediate connection terminal 384 and the positive connection terminal 386, while at the same time creating a short circuit between the intermediate connection terminal and the positive connection terminal, thereby removing the control function of the LMU 310 from the SPVPG system. As described further herein, each of these modulations in functioning of the LMU 310 may be used, for example, through various observations of functioning of other system elements, to determine and identify the connectivity topology of the LMU 310 within the system.

As described further herein, modifying the operation of the LMU 310 to manipulate the output of the solar panel can cause changes in the power production operation of the entire SPVPG system or portions thereof (e.g., a SLMU, an inverter) that may be observed and stored by other parts of the system, such as, for example, other LMUs and/or one or more MMU(s). These changes to the system operation may be interpreted as indicating connections between the LMU 310 and other parts of the SPVPG system. For example, an indication of a connection may be determined from an operational parameter of the system or a change therein. As described further herein, an MMU may instruct an LMU 310 to modify the power production of a solar module 380 and may thereafter receive power output information (e.g., from another LMU or an inverter) and interpret the information as including an indication of how the instructed LMU 310 is connected within the system (e.g., a connectivity topology).

In one embodiment, an LMU 310 is instructed to create a short circuit between positive connection terminal 386 and negative connection terminal 382 and, in response, due to the configuration of the LMU and other LMUs on the same string, the voltages provided by other LMUs on the string will rise. Another LMU on the string, an SLMU, or other component of the SPVPG system (e.g., an inverter handling the string) may detect the change and report the details of the change to the MMU. For example, a component of the SPVPG system may update or report operational parameters to an MMU, such as, for example, on a schedule and/or when operational parameters change (e.g., by more than a threshold amount). The MMU, having instructed the LMU 310 to create the short circuit will interpret the information (e.g., operational parameters) received from the components in the SPVPG system in combination with the instruction sent to determine information about where the instructed LMU 310 is located in the system. As described further herein, the same or similar actions may be ordered and/or repeated with multiple LMUs while determinations are made with respect to a connectivity topology sought to be known in the SPVPG system.

In one embodiment, a connection with an LMU may be detected through receiving an indication of a changed operational parameter of an SPVPG component, such as an increased voltage in one or more other LMUs, a shift in power production by an inverter, or an elimination of current on a string bus. For example, an LMU that is connected in series on a string bus and that is instructed to create a short circuit between its series connections to the bus will cause one or more other LMUs on the string bus to increase its voltage. In this example, each of the LMUs showing increased voltage may be associated together as being connected to the same string bus. In another embodiment, a connection with an LMU may be detected through receiving an indication of a decreased or eliminated current. For example, an LMU that is connected in series on a string bus and that is instructed to create an open circuit between its series connections to the bus will cause the other LMUs on the string bus to cease having current flow through the LMUs because the open circuit of the instructed LMU in series connection will interrupt the current for the entire string. In this example, each of the LMUs showing eliminated current may be associated together as being connected to the same string bus.

Parallel connections between LMUs and buses may be investigated via similar instructions sent to one or more LMUs and along with similar received operational parameters. In one embodiment, an LMU may be instructed to create an open circuit between its bus connections, and other LMUs connected to the same bus in parallel may respond with a shift in either current or voltage output production and/or the power output of the entire bus may shift. In another embodiment, an LMU may be instructed to create a closed circuit between its bus connections, and other LMUs connected to the same bus in parallel (and/or the entire bus) may respond with a decrease or elimination of voltage and/or current for the bus.

In one embodiment, an SLMU is included in the SPVPG system, as further described and referenced herein. Exemplary embodiments of instructions to an LMU, as described further herein, may be similarly directed to an SLMU and operational parameters may be similarly received and interpreted to indicate connections of SLMUs and/or LMUs connected to the SPVPG system.

Figure 4:
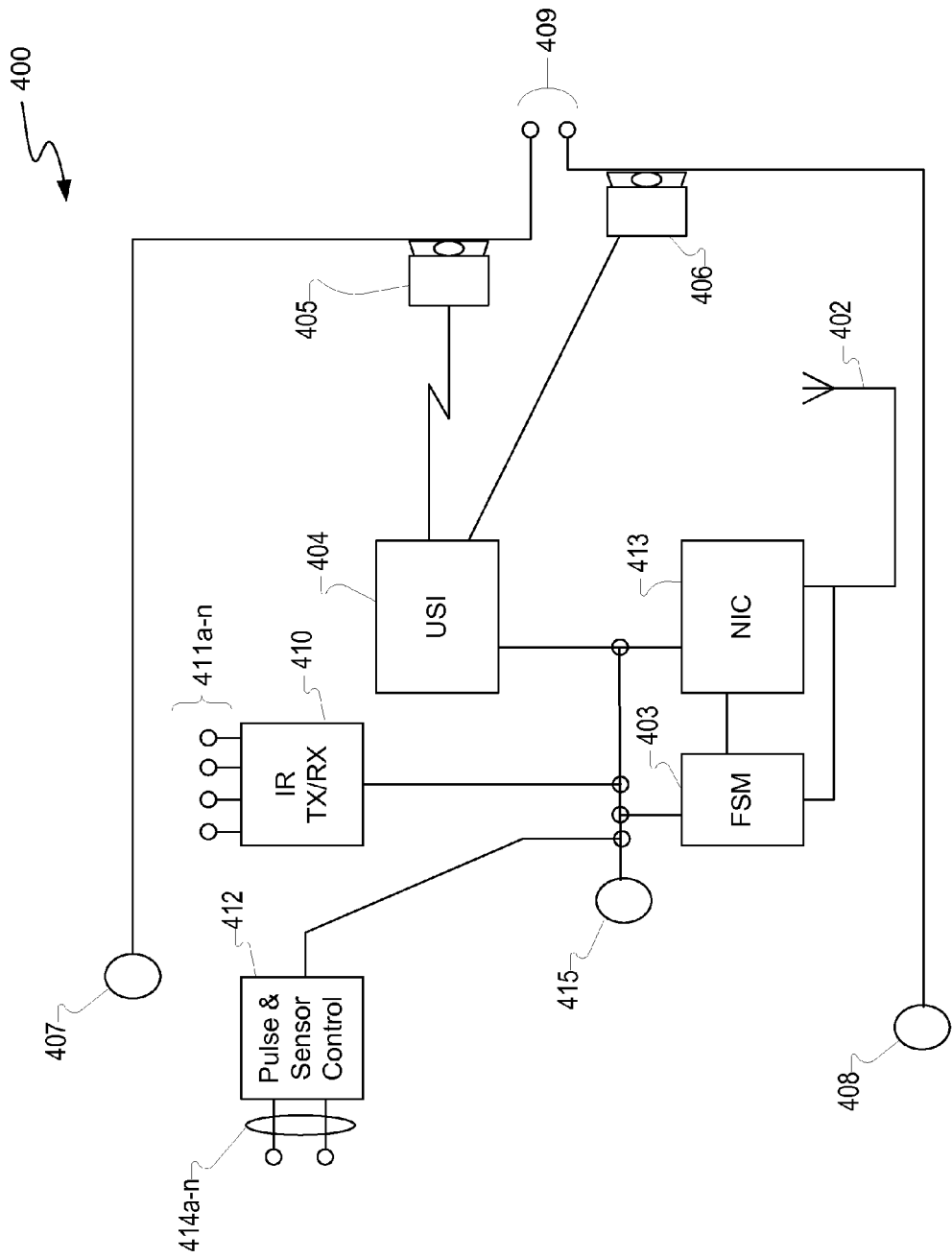
FIG. 4 shows exemplary communications systems that may be used to determine a connectivity topology of LMUs in an SPVPG system.

FIG. 4 shows exemplary communications systems 400 that may be used to determine a connectivity topology of LMUs in an SPVPG system. As described further herein, communications systems 400 may be included within an MMU or may be external to an MMU. Exemplary communications systems 400 may connect to an MMU through a bus 415 that allows the communications systems 400 to transfer information to the portions of the MMU, such as a single chip microcontroller (SCMC) or other processor within the MMU. In one embodiment, as described further herein, signals transmitted to an MMU through communications systems 400 may be used to determine connection information of LMUs within the SPVPG system, location information of the LMUs, and/or any combination thereof. For example, as described further herein, a signal strength measurement may be used to determine a location of an SPVPG system component and/or a distance between two SPVPG system components. As another example, as described further herein, a signal transmitted along a power line of the SPVPG system, such as power lines 407 and 408, may be used to determine a connection with that power line.

In one embodiment, communications systems 400 may each be associated with either an MMU, an LMU, a combiner box or another system component. In one embodiment, a communications device is integrated with an SPVPG system component. In another embodiment, a communications device is separated from the system component. In some embodiments, the physical positioning of the communications device is at a predetermined physical relationship with the SPVPG component, such as a predetermined distance from an MMU or a combiner box.

As further described and referenced herein, an MMU may contain a SCMC that may communicate with other system components through modulating communications onto power lines of the SPVPG system. For example, as described further herein, an MMU may modulate communications signals onto power line 407 and/or power line 408, and may receive information that the signal was received at an LMU site, thereby identifying one or both of these power lines as connected to the LMU. For example, an MMU may transmit a signal (e.g., communications with information) over a power line 408 through string bus connection 409 and an LMU may receive the signal, thus indicating a connection of the LMU to power line 408. In one embodiment, as described further herein, a signal transmitted may contain information to be communicated, for example, between the MMU and the LMU. In another embodiment, a signal transmitted may not contain information to be communicated, apart from the presence of the signal and/or its strength.

In one embodiment, communications signals and signals for determining connections may be modulated on power lines and/or multiplexed on power lines for communicating and/or determining connectivity of LMUs. For example, signals may be transmitted between an MMU and an LMU, or alternatively, between two LMUs. In one embodiment, a LMU and/or its connection to power lines of the SPVPG system may include a blocking filter to limit or exclude signals from travelling beyond the blocking filter, such as, for example, to a neighboring LMU. For example, an LMU may block a signal from transmitting along a power line beyond that LMU with a blocking filter (e.g., dampening device). In one embodiment, the blocking filter attenuates only a portion of the signal on the power lines, such as a connection-determining portion of the signal, but not a communications portion of the signal. In another embodiment, the blocking filter reduces a portion of the signal on the power lines by a predetermined amplitude. In one embodiment, the blocking filter is adjustable by the LMU. For example, the blocking filter may be activated or deactivated by the LMU, such as, for example, to allow a connection-determining signal to pass to a neighboring LMU at some time periods and not at other time periods. In one embodiment, the blocking filter is adjustable based on a command from the MMU. In another embodiment, the blocking filter may be tunable in its effect on a modulated signal or in its effect on a frequency of a signal. For example, a blocking filter may be tuned to eliminate a certain frequency band from the signal that is associated with the LMU such that the connection-determining signal will include an indication that the signal has travelled on the power line past the blocking filter and, hence, has travelled past a connection with the LMU.

In one embodiment, communications systems 400 include a pulse and sensor control device 412 that is connected to the power converter and control system of one or more LMUs in the SPVPG system through connections 414a-414n. For example, the pulse and sensor control device 412 may instruct an LMU to transmit a connection-determining signal onto a power line of the SPVPG, as described further herein. In one embodiment, the pulse and sensor control device 412 may communicate commands from the MMU to instruct the LMU to modulate certain signals onto power lines. In another embodiment, the pulse and sensor control device 412 may include a processor that determines modulation of signals and/or control of a blocking filter associated with the LMU.

In one embodiment, communications systems 400 include ultrasonic transceivers 405 and 406 (e.g., transmitter and receiver pairs, transducers). For example, an ultrasonic interface 404 may connect to an MMU and provide an ultrasonic signal link between the MMU and power lines 407 and 408.

In one embodiment, ultrasonic transceivers 405 and 406 may be coupled to power lines 407 and 408. For example, ultrasonic transceivers 405 and 406 may transmit and receive ultrasonic vibrations on power lines 407 and 408. In one embodiment, an MMU may transmit ultrasonic vibrations through ultrasonic transducer 405 onto power line 407 which may be received by another ultrasonic transducer connected to a power line physically connected to power line 407, such as through string bus connection 409. A received ultrasonic signal on a power line may provide indications of connection information related to certain system components (e.g., LMU, combiner box, inverter) physically connected to the power line. As described further herein, indications may be transmitted to the MMU through communications links, such as through the communications links between an LMU and the MMU.

In one embodiment, communications systems 400 include an electromagnetic antenna 402, such as a networking antenna connected to a network interface card (NIC) 413. As described further herein, NIC 413 may be used to communicate information (e.g., commands, instructions, status information) to and/or from system components such as an MMU with another system component such as an LMU or inverter. A field strength metering (FSM) device 403 may be used for monitoring the signal strength of the electromagnetic signal (e.g., wireless communication signal). In one embodiment, the FSM device 403 may be used in conjunction with the NIC 413. For example, a wireless signal that is transmitted while a wireless communications link is active may be measured by the FSM device 403 to determine a signal strength. In another embodiment, the FSM device 403 may be used to measure signals that are not part of a wireless communications link, or when such a link is not active. For example, a wireless signal may be transmitted and received by the antenna 402 while a wireless communications link is attempting to be established by the NIC 413. In one embodiment, an MMU may receive a signal strength measurement from FSM device 403 through line 415. For example, a signal strength of a wireless link may be received from the FSM device 403 and may be in turn communicated to the MMU.

In one embodiment, communications systems 400 include an infrared transceiver 410 (e.g., receiver/transmitter pair). In one embodiment, the infrared transceiver 410 is connected with or located near an MMU. In another embodiment, the infrared transceiver 410 is connected to another SPVPG system component, such as, for example, a combiner box. In one embodiment, another infrared transceiver may be associated with an LMU, such as integrated with an LMU, as described and referenced further herein. Infrared transceiver 410 may include a signal strength measurement device and may include one or more directional sensors 411a-411n that are centered on different directions. For example, a directional sensor 411a may be placed such that its sensitivity is centered orthogonally to another directional sensor 411b. In one embodiment, infrared transceiver 410 is adapted to communicate and/or to measure signal strength separately on one or more directional sensors 411a-411n. For example, signal strengths from different directional sensors 411a-411n may be compared. As described further herein, signal strength information may be sent from an LMU or another system component to an MMU for determination of connectivity topology and/or location information based on the signal strength information.

In one embodiment, signals transmitted between an MMU and another system component may include information such as command/instruction information, control information, status information, or identification information. In another embodiment, signals transmitted may be used solely to measure signal strength at a receiver that receives the signal. In another embodiment, signals transmitted may include information, yet be transmitted solely for use in determining a signal strength. For example, a signal may include identification information of the transmitting system component and/or of the receiving system component in order to identify the measurement of the signal's strength, for example, for use in measuring distance between system components and identifying which distance is being measured.

In one embodiment, as further described herein, communications systems 400 are operated by an MMU based on a schedule, such as, for example, transmitting signals on portions of the communications systems based on a predetermined sequence and timing. In another embodiment, as further described herein, communications systems 400 are operated by an MMU in response to information received from another component, such as an LMU. In another embodiment, communications systems 400 may continually receive signals (e.g., asynchronously, in an unscheduled manner), and may relay those signals to the MMU or other system component as they are received.

In one embodiment, connection information (e.g., information about a connectivity topology of the SPVPG system) may be used with other information known about the SPVPG system, such as location of certain portions of the system, such as the physical location of one or more LMUs.

Figure 5:
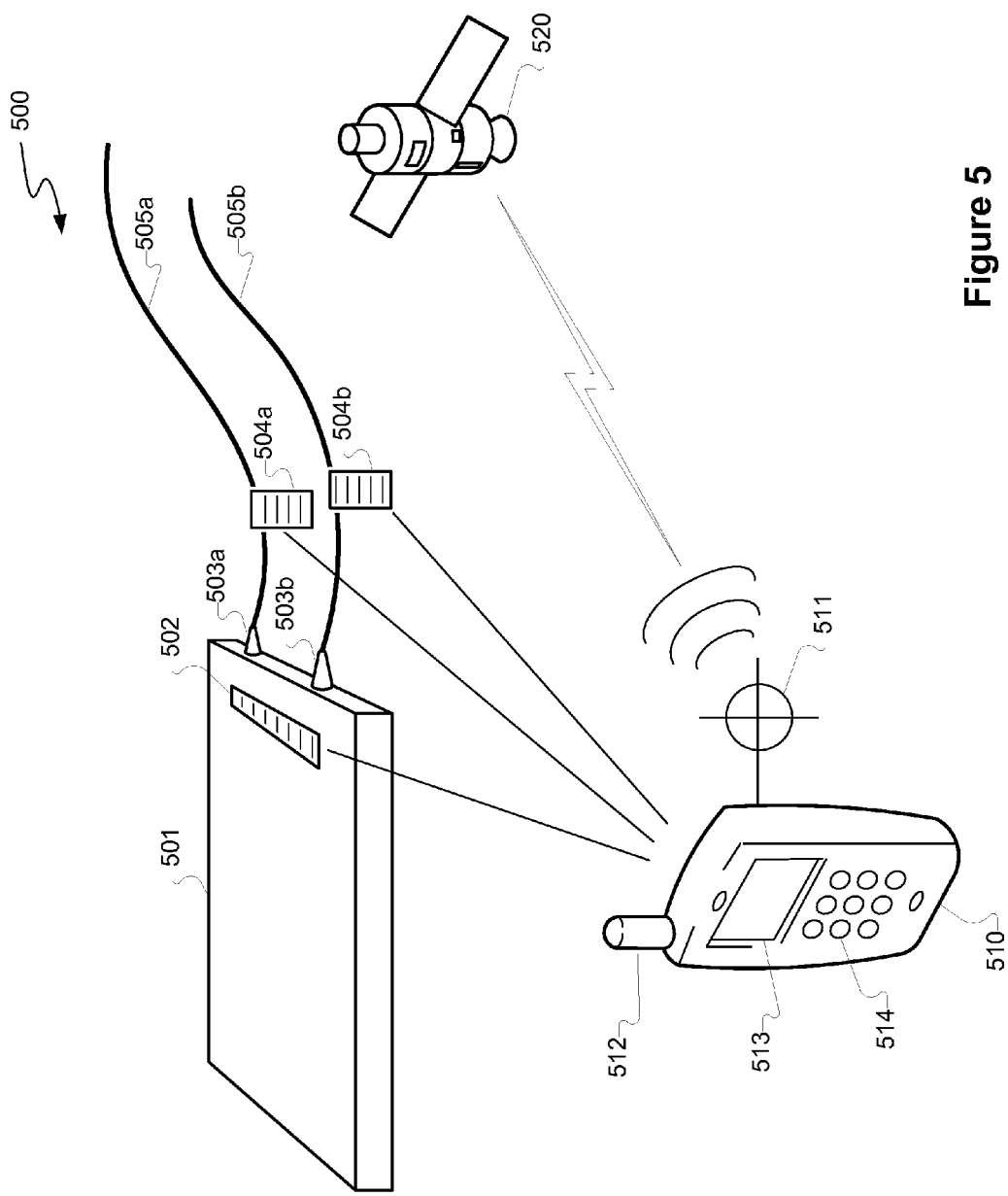
FIG. 5 shows an exemplary system that may be used to establish the location of an LMU or other component of an SPVPG system and power lines and connect the LMU to the system, according to an embodiment of the present disclosure.

FIG. 5 shows an exemplary system 500 that may be used to establish the location of an LMU 501 or other component of an SPVPG system and power lines 505a and 505b connecting the LMU to the system, according to an embodiment of the present disclosure. In one embodiment, system 500 is used during installation or maintenance of an SPVPG component, such as an LMU 501 and/or power lines 505a and 505b. Portable device 510 may be used to identify a system component via identification tag (e.g., tag 502). For example, portable device 510 may include a barcode reader capable of reading an identification tag 502 containing a barcode on an LMU 501. In one embodiment, the portable device 510 includes a location discovery system, such as the Global Positioning System (GPS), and uses the location discovery system to associate the identification of a system component with a particular physical location. For example, portable device 510 may receive an identification of an LMU 501 and associate that LMU with the physical position of the portable device 510 determined via GPS antenna 511 and satellite system 520.

In one embodiment, system 500 provides for identification of other system components, such as wires, lines, and connections. For example, the identification tags 504a and 505b may be associated with the power lines 505a and 505b, respectively. As another example, the identification tags 504a and 504b may be associated with the connections 503a and 503b, respectively, between the power lines 505a and 505b and the LMU 501. In one embodiment, identification information included with identification tags, such as identification tag 504a, includes information about a connection, such as connection 503a between system components power line 505a and LMU 501. In another embodiment, identification information may be added through the portable device 510, such as through manual entry on a keypad 514 or through wireless communications 512. For example, an identification tag 502 may include certain information identifying the LMU 501, and further information may be associated with the LMU (e.g., model type, connections observed in the SPVPG system installation) through manual entry and/or other entry means, such as wireless or visual information from a camera on the portable device 510. A screen 513 on the portable device 510 may be used to interface with a user, for example, to confirm reading of an identification tag, successful determination of location or physical position, and/or entry of manual information to be associated with the information retrieved through other means.

In one embodiment, a GPS system is used for determining physical location. In another embodiment, another system is used, such as a local grid of coordinates or radio beacons in the SPVPG, radio telemetry, and/or triangulation to visible objects.

In one embodiment, an identification tag (e.g., 502) is read automatically using a barcode on the tag and barcode reader on the portable device 510. In another embodiment, an identification tag (e.g., 502) is read by an operator and manually entered into a portable device 510. In another embodiment, radio frequency identification (RFID) technology is used by the portable device 510 to receive identification information from the identification tag (e.g., 502).

Information about location may be used by systems and methods described herein in conjunction with information about connectivity between system components to create or enhance connectivity topology determinations. For example, connectivity information that an LMU 501 is connected to power lines 505a and 505b may be used to determine that the LMU 501 is connected to a string bus closer to a combiner box than another LMU connected to the power line 505a and another power line (not shown) that is known to be in a physical location that is further from the combiner box.

Figure 6:
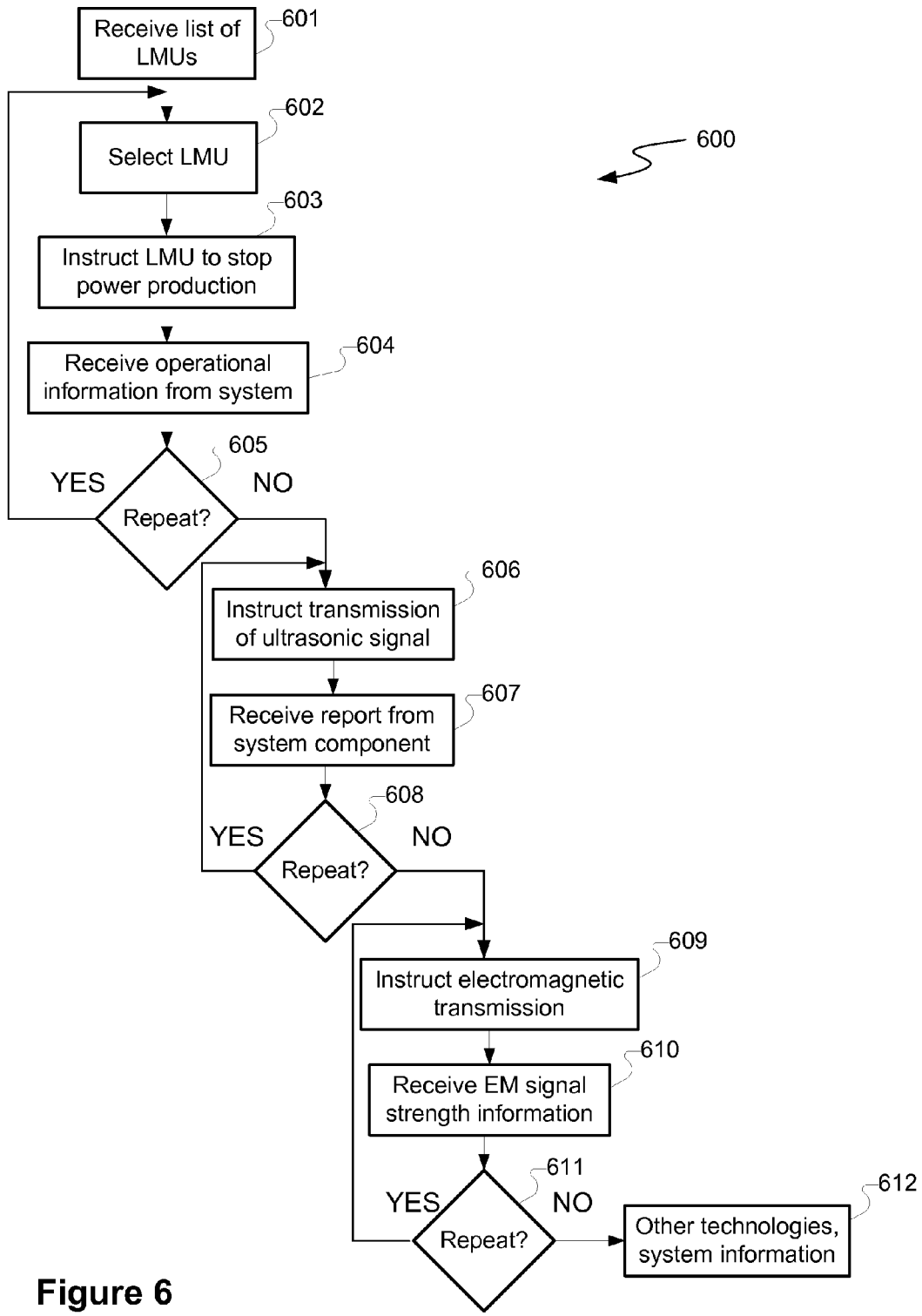
FIG. 6 shows an exemplary flowchart of an embodiment of a process for determining the connectivity topology of an SPVPG system.

FIG. 6 shows an exemplary flowchart of an embodiment of a process 600 for determining the connectivity topology of an SPVPG system. The process 600 begins in step 601 with receiving a list of LMUs in the SPVPG system. The list of LMUs may be received in step 601 from any of a number of locations, including a storage in an MMU, a portable device that has stored/logged information regarding LMUs in the SPVPG system, or a data repository. In one embodiment, the list of LMUs contains information about the location of one or more of the LMUs, for example a physical location of the LMU. In another embodiment, the list of LMUs contains limited or no information about the location or connections of the LMUs within the SPVPG system. In another embodiment, the list of LMUs contains location information and/or connection information about one subset of LMUs and contains no location or connection information about a second subset of LMUs.

The process 600 includes selecting an LMU in step 602. The selection of an LMU may be performed in a step-wise fashion along the list of LMUs or may be as a result of some other determination. In one embodiment, location information or connectivity information is used to select an LMU. For example, an LMU may be selected based on connectivity information that is lacking for the LMU or based on connectivity information indicating that the LMU is connected to power lines (e.g., a string bus) that are connected to other LMUs that are either unidentified or about which there is missing information. In another embodiment, information about power production may be used to select an LMU in step 602. For example, an LMU may be selected for having a particularly high or low power production. As another example, an LMU may be selected for having a power production that is significantly influenced by changes in power production of other LMUs.

The process includes instructing the LMU to stop power production in step 603. Instructions to an LMU to stop power production and/or manipulations of power point tracking devices in the SPVPG may be used as further described herein to determine connectivity. Stopping power production may include, as described further herein, creating an open circuit or a short circuit in particular connections between a solar module and power lines of the SPVPG system. In one embodiment, stopping power production in step 603 includes a full stop of power production through the creation of static connections within the LMU. In another embodiment, stopping power production in step 603 includes a modification of power production to temporarily stop or store the power created from a solar module and disconnect such power from the power lines of an SPVPG system. In another embodiment, step 603 is substituted with a modification of power production by the LMU, including power production control and modulation as described and referenced further herein.

After stopping power production in step 603, or otherwise modifying power production in a different embodiment, the process receives operational information from the SPVPG system in step 604. The operational information received in step 604 may include modifications in power production of a portion of the SPVPG system. For example, an LMU connected to the same string bus as the LMU that stopped power production will respond with a change in one or more operational parameters such as voltage, current, etc. The changed operational information received in step 604 may be used to determine a connectivity topology of at least a portion of the SPVPG system through interpreting the changes in operational parameter(s) along with information about the instruction sent to the LMU and/or previously known connectivity information and/or location information. Thus, a connectivity topology of the SPVPG may be determined and constructed using the existing knowledge of the SPVPG system and changes to operational parameter(s) responsive to instructions to stop or vary power production transmitted to an LMU.

The process 600 includes determinations in steps 605, 608 and 611 of whether to repeat portions of the process based on whether the acquired information is sufficient to build or determine the desired connectivity topology. For example, after the operational information is received from the SPVPG system in step 604, a determination may be made in step 605 that the resulting connectivity topology based on the information is insufficient and/or that further changes in operational information may be desired, and that steps 602-604 will be repeated. The determination made in step 605 may include information about the desired detail of the connectivity topology, the ability to determine more of the connectivity topology based on repetitions of steps 602-604, and the other means available for determining more about the connectivity topology. For example, a connection order between LMUs may not be an important detail to be added into a connectivity topology, but the identification of an LMU as belonging to one subset or another may be significant and may inform the next step to be performed (e.g., step 602 or step 606) in the process 600.

The process 600 includes instructing the transmission of an ultrasonic signal in step 606. In one embodiment, the process 600 includes another step of determining which portion of the system, such as an LMU, should be instructed to transmit ultrasonic signals in step 606. In one embodiment, instructions are sent to one or more LMUs to transmit ultrasonic signals on power lines of the SPVPG system. In another embodiment, all ultrasonic transducers in the SPVPG system are instructed to transmit ultrasonic signals on power lines. In one embodiment, instructions for multiple transducers to transmit may include instructions causing the ultrasonic signals to be multiplexed, such as multiplexed by time, frequency, code, or other type of multiplexing, as described further herein. In another embodiment, instructions for multiple transducers to transmit may be created so that multiple transducers will transmit in a non-multiplexed manner, such as with overlapping times and/or frequencies.

In step 607 information (e.g., a report) is received from one or more system components regarding ultrasonic signals received by ultrasonic transducers connected to power lines. In one embodiment, as described further herein, an LMU receives information from a transducer indicating a received ultrasonic signal and communicates with an MMU the nature and/or content of the ultrasonic signal received. In another embodiment, an MMU receives a report of an ultrasonic signal received from another part of the SPVPG system. As described further herein, the received ultrasonic signal may include an indication of connection and/or location of the receiving and/or transmitting component of the SPVPG and that indication may be used to further determine a connectivity topology.

In step 608, the process 600 determines, as described further herein, whether process steps 606 and 607 should be repeated based on the information received or otherwise known relating to the connectivity topology.

The process 600 includes instructing the transmission of an electromagnetic (EM) signal in step 609, such as an infrared (IR), radio frequency (RF) or microwave signal. In one embodiment, the process 600 includes another step of determining which portion of the system, such as an LMU, should be instructed to transmit the EM signal in step 609. For example, a particular network interface card (NIC) associated with an LMU may be used to broadcast an EM signal on a wireless network communications band. As another example, a particular IR source that is centered on a particular direction may be instructed to transmit an IR signal. In another embodiment, an instruction is sent in step 609 to transmit an EM signal from multiple or all EM transmitters of the SPVPG system. As described further herein, multiple signal transmissions may be multiplexed or encoded to distinguish between received transmissions from multiple sources.

The process 600 includes receiving EM signal strength information in step 610. As described further herein, signal strength information may be determined from a signal in multiple ways, including measuring an analog value and/or setting a threshold above which signals will be registered as received. In one embodiment, information about a signal strength is determined by an LMU and transmitted through a communications means to an MMU for further processing. In another embodiment, information about a signal strength is processed into another format by an LMU, such as formatting information to include an indication of distance between the receiver and the transmitter of the EM signal. Various technologies for implementing EM transmitters and receivers in an SPVPG system are described further herein.

In step 611, the process 600 determines, as described further herein, whether process steps 609 and 610 should be repeated based on the information received or otherwise known relating to the connectivity topology.

In step 612, the process 600 may further use other technologies or system information to determine the connectivity topology to a desired level of detail, as described further herein.

Figure 7:
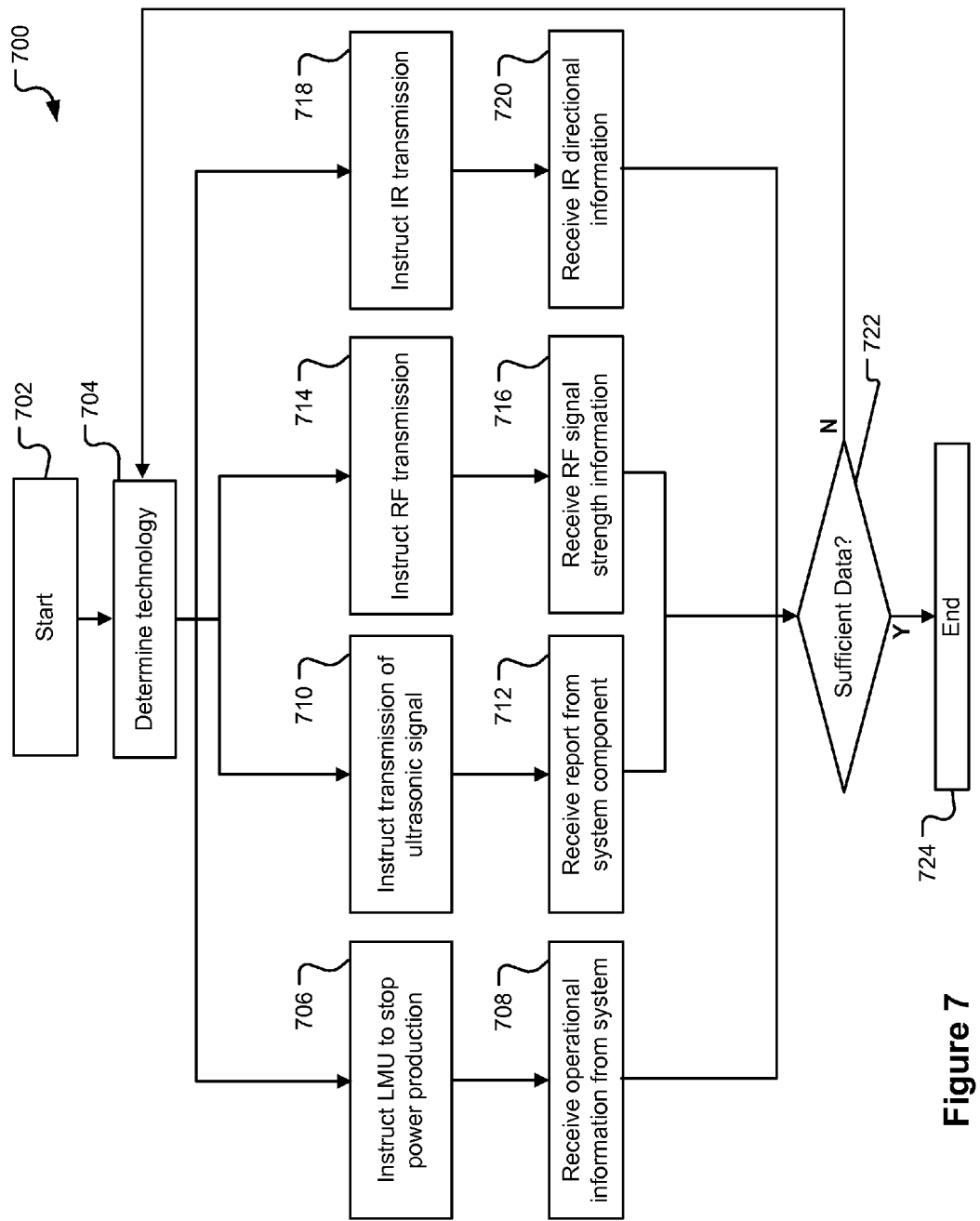
FIG. 7 shows an exemplary flowchart of another embodiment of a process for determining the connectivity topology of an SPVPG system.

FIG. 7 shows an exemplary flowchart of another embodiment of a process 700 for determining the connectivity topology of an SPVPG system. The process starts in step 702 and determines a technology to use in eliciting information for determining a connectivity topology of the SPVPG system. For example, any of the technologies described further herein for determining connection information and/or location information may be selected in step 702. As described further herein, the technology selected in step 702 may be selected based on the information already known about components in the SPVPG system, a known connectivity topology (e.g., an incomplete connectivity topology), and/or a desired portion of a connectivity topology (e.g., the connections of a specified LMU). Based on the selection performed in step 702, the process 700 proceeds to investigate the SPVPG system using the selected technology to determine further aspects about the SPVPG system, as described further herein.

In one embodiment, the process 700 selects multiple different technologies in step 702 and performs multiple investigations using those technologies simultaneously. For example, process 700 may at the same time instruct an LMU to stop power production in step 706 and instruct a transmission of an ultrasonic signal in step 710.

In one embodiment, the process 700 instructs an LMU to stop power production in step 706, as described further herein. After such an instruction in step 706, the process 700 receives operational information from a system component in step 708, as described further herein. Steps 706 and 708 may be performed in parallel and/or simultaneously with other steps in the process 700.

Process 700 includes determining whether sufficient data has been received or is otherwise known to create a desired connectivity topology in step 722. As described further herein, a connectivity topology may contain any level of detail and may be improved upon to meet a certain level of detail. Also as described further herein, different types of information may be included and used in determining a connectivity topology. For example, the process 700 may determine that there is not sufficient data in step 722 and may repeat step 704 of determining a technology to use to receive further information about the connectivity topology. The process 700 may inquire with multiple different LMUs using multiple technologies described further herein and receive only partial information from each iteration. The process 700 may then prepare a composite sketch of connectivity topology based on analysis of the information received. Information used in analysis could include connectivity indications and location information, as described further herein. When the process 700 determines in step 722 that there is sufficient data for determining the connectivity topology at a desired level of detail, the process 700 may end in step 724.

Process 700 may determine in step 704 to use one or more of several different technologies, as described further herein. For example, process 700 may instruct the transmission of ultrasonic signals along lines or wires in the SPVPG system in step 710 and may receive a report from system component(s) in step 712. As another example, process 700 may instruct the transmission of radio frequency (RF) signals in step 714 and may receive information about an RF signal strength of the received RF signal in step 716. As another example, process 700 may instruct the transmission of a directional electromagnetic transmission (e.g., infrared) in step 718 and receive directional information in step 720 related to receiving the electromagnetic transmission. Process 700 may use each of these technologies, as described further herein, to determine a connectivity topology for the SPVPG system.

It is clear that many modifications and variations of this embodiment can be made by one skilled in the art without departing from the spirit of the novel art of this disclosure. For example, the systems and method herein disclosed can be applied to energy generating systems other than solar photovoltaics (e.g., windmills, water turbines, hydrogen fuel cells, to name a few). Also, while specific voltage values and thresholds may have been disclosed, other reference points for the target voltage can also be used. These modifications and variations do not depart from the broader spirit and scope of the present disclosure, and the examples cited here are illustrative rather than limiting.

What is claimed is:

1. A solar photovoltaic power generation system, comprising:
   a set of power lines;
   a plurality of photovoltaic panels;
   a plurality of local management units, each of the plurality of local management units coupled between the set of power lines and a corresponding photovoltaic panel of the plurality of photovoltaic panels; and
   a master management unit having:
      a communications device adapted to transmit instructions to the plurality of local management units to stop the local management units outputting to the set of power lines one at a time and to receive power production information from the local management units outputting power to the set of power lines of the solar photovoltaic power generation system, and
      a processor adapted to determine a topology of connections among the plurality of local management units on the set of power lines based at least in part on the power production information.

2. The solar photovoltaic power generation system of claim 1, wherein each of the plurality of local management units is adapted to stop outputting power to the power lines via one of: a short circuit condition and an open circuit condition.

3. The solar photovoltaic power generation system of claim 1, further comprising:
   a string local management unit adapted to transmit power production information to the master management unit.

4. The solar photovoltaic power generation system of claim 1, wherein the master management unit further comprises:
   a memory associated with the processor and storing location information about the plurality of local management units;
   wherein the processor is further adapted to determine the topology based on the location information.

5. The solar photovoltaic power generation system of claim 1, wherein each of the plurality of local management units comprises:
   a direct current (DC) to DC converter to receive a DC input from the corresponding photovoltaic panel and to output a DC output to the set of power lines;
   a measurement circuit to determine power production level; and
   a communications device to receive instructions to control the DC to DC converter from the master management unit and to transmit data representing the power production level to the master management unit.

6. The solar photovoltaic power generation system of claim 1, further comprising an ultrasonic transducer to transmit ultrasonic signals on the power lines and to listen to ultrasonic pulses on the power lines;
wherein the processor is adapted to determine the topology further based on the ultrasonic transducer listening to the ultrasonic pulses on the power lines.

7. The solar photovoltaic power generation system of claim 1, further comprising:
an electromagnetic radiation field strength measuring device to measure wireless network communications signals from the plurality of local management units;
wherein the processor is adapted to determine the topology further based on the wireless network communications signals measured by the electromagnetic radiation field strength measuring device.

8. The solar photovoltaic power generation system of claim 1, further comprising:
an infrared (IR) transceiver to detect location information of the plurality of local management units;
wherein the processor is adapted to determine the topology further based on the location information.

9. A solar photovoltaic power generation system, comprising:
a set of power lines;
a plurality of photovoltaic panels;
a plurality of local management units, each of the plurality of local management units coupled between the set of power lines and a corresponding photovoltaic panel of the plurality of photovoltaic panels;
a transmitter adapted to transmit a signal to the local management units;
a receiver adapted to receive at least one response to the signal; and
a master management unit comprising:
a communications device adapted to communicate information with the local management units connected to the set of power lines of the solar photovoltaic power generation system, and
a processor adapted to determine a topology of connections among the plurality of local management units on the set of power lines based at least in part on the at least one response.

10. The solar photovoltaic power generation system of claim 9, wherein the transmitter is adapted to transmit the signal from a combiner box.

11. The solar photovoltaic power generation system of claim 9, wherein the signal is modulated on the set of power lines on a first string bus of the solar photovoltaic power generation system before the signal is modulated on a second string bus of the solar photovoltaic power generation system.

12. The solar photovoltaic power generation system of claim 9, wherein the receiver includes one of:
an electromagnetic radiation field strength measuring device;
an infrared receiver; and
an ultrasonic transducer connected to the set of power lines.

13. A method comprising:
receiving identification information of a plurality of local management units in a solar photovoltaic power generation system having a plurality of photovoltaic panels, each of the plurality of local management units coupled between a corresponding one of the plurality of photovoltaic panels and a set of power lines of the solar photovoltaic power generation system;
transmitting a command addressed to a first local management unit of the plurality of local management units based on the identification information, the command to instruct the first local management to change power output from a first photovoltaic panel of the plurality of photovoltaic panels, the first photovoltaic panel controlled by the first local management unit;
after transmitting the command to the first local management unit, receiving first power production information from at least one of the plurality of local management units other than the first local management unit; and
determining a topology of connections of the first local management unit within the solar photovoltaic power generation system based on the first power production information.

14. The method of claim 13, wherein the connections include a connection of a first subset of the plurality of local management units including the first local management to the set of power lines, which is a first set of power lines, and a connection of a second subset of the plurality of local management units to a second set of power lines, different from the first set of power lines.

15. The method of claim 13, further comprising:
receiving location information of the first local management unit;
wherein the determining of the topology of connections of the first local management unit is based further on the location information.

16. The method of claim 15, wherein the receiving the location information includes:
receiving a wireless transmission from the first local management unit; and
determining the location information from a signal strength of the wireless transmission.

17. The method of claim 15, wherein the topology includes an order of connection with the set of power lines as between the first local management unit and a second local management unit also connected to the set of power lines.

18. The method of claim 13, wherein the command is to instruct the first local management to stop power output from the first photovoltaic panel to the set of power lines, which is a first set of power lines, the method further comprising:
transmitting a command to the first local management unit to restore power output from the first photovoltaic panel;
transmitting a command addressed to a second local management unit of the plurality of local management units to stop power output from a second photovoltaic panel of the plurality of photovoltaic panels, the second photovoltaic panel controlled by the second local management unit;
after the transmitting of the command to the second local management unit, receiving second power production information from at least one of the plurality of local management units other than the second local management unit; and
determining a topology of connections of the second local management unit within the solar photovoltaic power generation system based on the second power production information.

19. The method of claim 18, further comprising:
identifying a subset of the local management units that are on a second set of power lines different from a first set of power lines on which the first local management unit is located based on the first power production information; and selecting the second local management unit from the subset for the transmitting of the command to the second local management unit.

\* \* \* \* \*